United States Patent [19]

Sasaki et al.

[11] 4,262,340
[45] Apr. 14, 1981

[54] SEMICONDUCTOR MEMORY DEVICE

[75] Inventors: Nobuo Sasaki; Yasuo Kobayashi; Takashi Iwai, all of Kawasaki; Motoo Nakano, Yokohama, all of Japan

[73] Assignee: Fujitsu Limited, Tokyo, Japan

[21] Appl. No.: 92,858

[22] Filed: Nov. 9, 1979

[30] Foreign Application Priority Data

Nov. 14, 1978 [JP] Japan .................. 53/140102

[51] Int. Cl.³ ............................................. G11C 11/40
[52] U.S. Cl. .................................. 365/154; 365/148; 365/189; 307/238.8
[58] Field of Search ............... 365/148, 45, 154, 189; 307/238, 279

[56] References Cited

U.S. PATENT DOCUMENTS 4,212,083   7/1980   Rao .................................. 365/154

Primary Examiner—Terrell W. Fears
Attorney, Agent, or Firm—Staas & Halsey

[57] ABSTRACT

A semiconductor memory device provides a plurality of bit lines, a plurality of memory cells each of which is connected to a pair of different bit lines, a plurality of common word wires each of which is connected to the memory cells via a transmission gate. A characteristic feature of the present invention is to provide at least one amplifier between two memory cells which are connected to a word line or a bit line so as to prevent an increase of the access time of the memory device.

7 Claims, 11 Drawing Figures

SEMICONDUCTOR MEMORY DEVICE

BACKGROUND OF THE INVENTION

1. Field of the Invention

The present invention relates to a semiconductor memory device, especially to a random access memory which is formed by using MOS FETs.

2. Description of the Prior Art

A memory cell used in a static random access memory which is formed as a semiconductor memory device, for example, a C-MOS (complementary metal oxide semiconductor) field effect transistor construction which is formed with a flip-flop circuit composed of two pairs of C-MOS invertors and two transmission gates, each gate being formed of one MOS field effect transistor. The transmission gate is placed in an off state by a voltage on the word line when information is stored in the memory cell and the transmission gate is placed in an on state when the information is written in or read out from the memory cell. Bit lines, connected to the flip-flop circuit, write in or read out the information via the transmission gate circuit which is kept in the on state. That is, the word lines and the bit lines are extended vertically and horizontally in mesh form, and the memory cells are connected to each cross point of the word lines and the bit lines.

When an MOS integrated circuit with such memory cells is formed by using an SOS (silicon on sapphire) construction, it is recognized that the access time to the memory cell increases when a gate insulating (silicon dioxide) film of the MOS field effect transistor becomes thinner than 500 [Å]. In the memory cell which is formed by using the usual MOS field effect transistor having a bulk construction, as in the memory cell using an MOS field effect transistor having an SOS construction, it is recognized that the access time to the memory cell increases when the gate insulating film of the transistor becomes thinner than 300 [Å].

This is due to the following reason. In the random access memory, when the bit lines, for example, are formed by using a metal, such as an aluminum material, the word lines are formed by using a polycrystalline semiconductor material such as polycrystalline silicon material. Therefore, the word line has a high specific resistance and one word line is equivalently represented by an RC network which is formed by risistances R being connected in series, and capacitances C corresponding to the gate capacitance of the MOS field effect transistors forming the transmission gate being connected to the word lines in parallel. The value of the capacitances C in the above RC network increases when the thickness of the gate insulating film decreases; therefore, the delay time (which is the time from when the driving terminal is placed in a high level to when each point of the word line is placed in a high level) of the signal which is supplied from a drive terminal of the word line where a driving transistor is connected increases along the word line. When the MOS random access memory becomes large in size or high in integration density, the word line becomes long, and the problem of the delay time in serious. In the memory cell, which is positioned near the drive terminal, the problem of the delay time is not serious; however, in the memory cell, which is distant from the drive terminal, the problem of the delay time is very serious.

The deterioration of the access time in the random access memory is due to the fact that the word lines are formed by the polycrystalline silicon material; therefore, the following countermeasures can be considered, that is, (a) decreasing the value of the resistance in the polycrystalline silicon material, (b) forming the word line by using an aluminum material. However, with respect to the item (a), the value of the resistance in the polycrystalline silicon material has a certain limitation. With respect to the item (b), when the bit lines are formed by a polycrystalline silicon material, the same problem that occurs in the word lines also occurs in the bit lines. When the bit lines and the word lines are both formed by an aluminum material, the multi layer aluminum wiring construction technique should be used; therefore, the manufacturing process becomes difficult.

The access time to the memory cell is determined by the memory cell having the most delayed response time in the word line, so that the access time of the memory cell is increased. Therefore, MOS field effect transistors having a short channel are used for increasing the speed of the function of the MOS field effect transistor. For the MOS field effect transistors to have a short channel, it is required that the gate insulating film of the transistors be formed by a thin film for the purpose of preventing the short channel effect.

SUMMARY OF THE INVENTION

An object of the present invention is to provide a random access memory, the access time of which is not delayed if a thin gate oxide film is used in the MOS field effect transistors included in the semiconductor memory device using word lines or bit lines made from a polycrystalline semiconductor material such as polycrystalline silicon.

Another object of the present invention is to provide a random access memory, the access time of which is not delayed if the long word lines or bit lines are used when the memory capacity is increased and/or the semiconductor chip becomes a large size.

The above-mentioned objects can be achieved by a semiconductor memory device which is comprised of a plurality of bit lines, a plurality of memory cells each of which is connected to a different one of the bit lines, a plurality of common word lines each of which is connected to the memory cells via a transmission gate, a semiconductor memory device comprising at least one amplifier between two memory cells which is connected to the word line or the bit line so as to prevent an increase of the access time to each memory cell.

Further features and advantages of the present invention will be apparent from the ensuing description with reference to the accompanying drawings, to which, however, the scope of the invention is in no way limited.

DETAILED DESCRIPTION OF PREFERRED EMBODIMENTS

Figure 1:
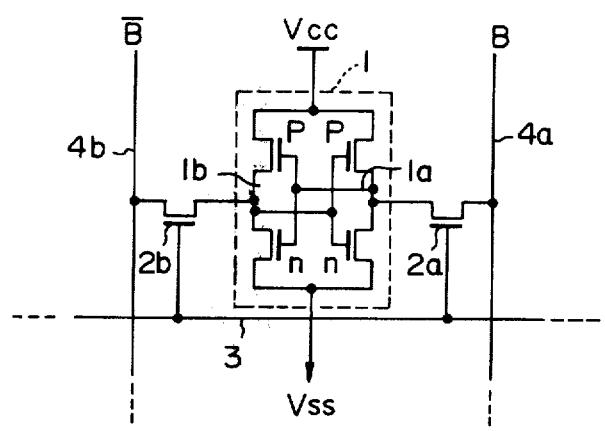
FIG. 1 illustrates a circuit of one example of a static type memory cell using C-MOS field effect transistors.

Referring to FIG. 1, a memory cell used in a static random access memory using C-MOS field effect transistor includes a flip-flop circuit 1 formed by two C-MOS invertors 1a and 1b, and two transmission gates 2a and 2b, each formed by one MOS field effect transistor. The transmission gates 2a and 2b are placed in an off state by the voltage on the word line 3 when information is stored in the memory cell. The transmission gates 2a and 2b are placed in an on state when information is written in or read out from the memory cell. Bit lines 4a, 4b each connected to the C-MOS invertors of the flip-flop circuit write in or read out the information signals B, $\bar{B}$ via the transmission gate circuits 2a, 2b which are kept in the on state. The word lines 3 and the bit lines 4a, 4b are extended vertically and horizontally in mesh form, and the memory cells are connected to each cross point of the word lines 3 and the bit lines 4a, and 4b. Therefore, the number of transmission gates 2a and 2b which are connected to one word line 3 is twice the number of the memory cells used in one word line.

In the memory cell which is formed by using an MOS field effect transistor having an SOS (silicon on sapphire) construction, it is recognized that the access time to the memory cell increases when the thickness Xox of the gate insulating film of the transistor becomes thinner than 500 [Å]. In the memory device which is formed by using the usual MOS field effect transistor having a bulk construction, the access time to the memory cell is larger than that of the memory device using the MOS field effect transistor having an SOS construction. However, the access time becomes small when a thin gate insulating film is used. In the memory device which is formed by an MOS field effect transistor having an SOS construction, the capacitances which are connected to the word line 3 are formed only by the gate capacitances of the transistors; the stray capacitances of wire and the junction capacitances, which occur in the memory cell using an MOS memory device having a bulk construction, can be neglected.

The following equation exists between the gate capacitance Cg of the transistor having an SOS construction and the thickness Xox of the gate insulating film of the transistor;

$$Cg \propto (1/Xox)$$

Figure 2:
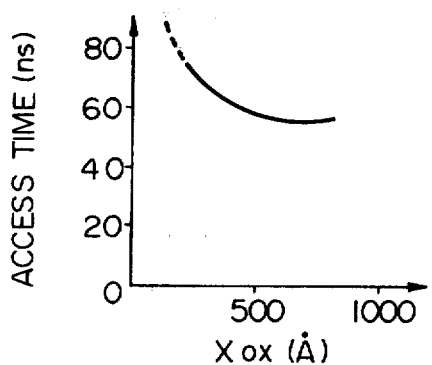
FIG. 2 illustrates a diagram showing the relation between the thickness of a gate insulating film and the access time to a memory cell in the SOS random access memory.

On the other hand, the following equation exists between a current amplification factor and the thickness Xox of the gate insulating film of the transistor:

$$\beta \propto (1/Xox)$$

that is, the current amplification factor β of the transistor used as a driver decreases when the thickness of the gate insulating film increases. Therefore, it is expected that the access time of the memory cell of a SOS construction does not depend on the thickness Xox of the gate insulating film. However, according to the result of the simulation, it is recognized that the access time increases when the thickness becomes smaller than 500 [Å], as shown in FIG. 2. Further, in the memory device which is formed by using a usual MOS memory device having a bulk construction, as in the memory cell using an MOS field effect transistor having an SOS construction, it is recognized that the access time to the memory cell increases when the gate insulating film of the transistor becomes thinner than 300 [Å]. It is understood that this phenomenon is due to the fact that the stray capacitances of wire connections and the junction capacitances can be neglected with respect to the gate capacitance which is determined by the thickness Xox of the gate insulating film when the thickness of the gate insulating film is smaller than 300 [Å] so that the function of the MOS field effect transistor having a bulk construction becomes similar to that of the MOS field effect transistor having an SOS construction.

Figure 3:
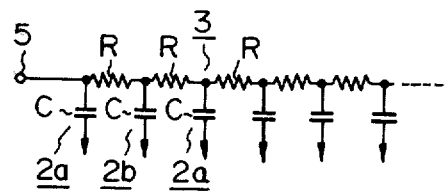
FIG. 3 illustrates an equivalent diagram of a word line in the SOS random access memory.

On the other hand, in the static type random access memory, usually when the bit lines 4a, 4b are formed by using a metal such as an aluminum material, the word line 3 are formed by using a polycrystalline silicon material. Therefore, as shown in FIG. 3, one word line 3 is equivalently represented by an RC network which is formed by resistances R which are connected in series, and capacitances C which correspond to the gate capacitance of the MOS field effect transistors forming the transmission gates 2a, 2b and which are connected to the word line in parallel, so that the access time to the memory device increases. The value of the capacitances C in the above RC network increases when the thickness Xox of the gate insulating film decreases; therefore, the delay time of the signal which is supplied from a drive terminal 5 of the word line where a driving transistor is connected increases along the word line 3. When the integration of the memory device increases and the word lines become long, the problem of the delay time is serious. In the memory cell which is positioned near the drive terminal 5, the problem of the delay time is not serious; however, in the memory cell which is distant from the drive terminal 5, the problem of the delay time is very serious.

Figure 4:
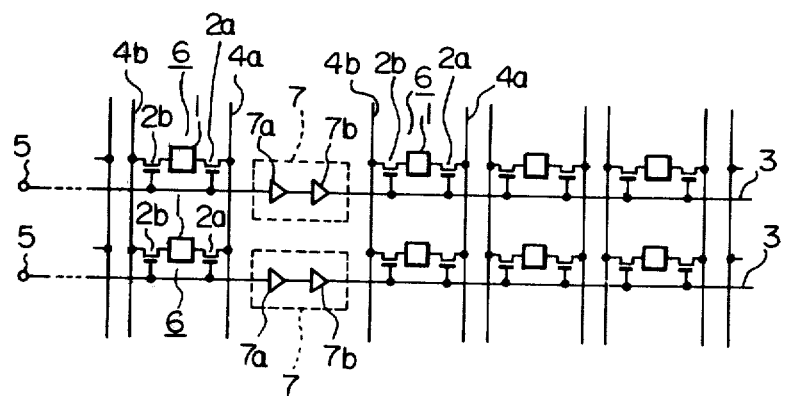
FIG 4 illustrates one embodiment of the circuit of the static memory cell using C-MOS transistors according to the present invention.

FIG. 44 is a circuit of one embodiment of the present invention. FIG. 4 illustrates one part of the static random access memory having the SOS construction, and the same symbols as those of FIG. 1 show the same parts as indicated in FIG. 1. Referring to FIG. 4, the memory cells 6 including one flip-flop circuit 1 and two transmission gates 2a, 2b are arranged in matrix form, and these memory cells 6 are connected to cross points between the word lines 3, 3, . . . , which are arranged horizontally, and the bit lines 4a, 4b; 4a, 4b; . . . , which are arranged vertically; and these memory cells 6 are selectively driven by the word lines and the bit lines. In the present invention, amplifiers 7 are inserted between the memory cells in the word line 3. The amplifier 7 is formed by two invertors 7a, 7b which are connected in series, so that the output and the input are in phase.

Figure 5:
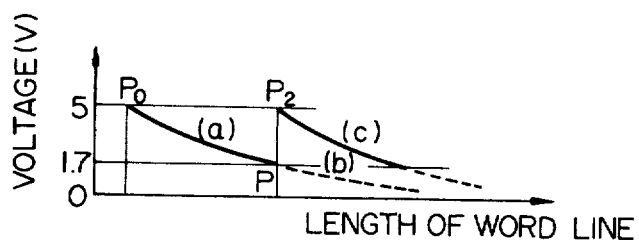
FIG. 5 illustrates a diagram showing a voltage distribution on the word line shown in FIG. 4.

When the amplifier 7 is placed in the word line 3, the voltage distribution on the word line 3 at a certain time after the voltage is applied to the driving terminal is shown in FIG. 5. Referring to FIG. 5, the horizontal axis illustrates the word line 3, $P_0$ illustrates the driving terminal, $P_1$ illustrates an input terminal of the amplifier 7, and $P_2$ illustrates an output terminal of the amplifier 7.

The driving terminal 5 is connected to a driver (not shown in the drawing) having a sufficient driving power, and when the word line 3 is selected, the voltage which is equal to the source voltage (in this example, the source voltage is 5 [V]) is supplied to the driving terminal 5. Therefore, the voltage at the position $P_0$ instantly rises to 5 [V], and after a certain time, the voltage is distributed in the word line 3 as shown in FIG. 5. When the voltage is distributed, as shown in line (a), in FIG. 5 after a time which is determined by the delay time of the RC network, the inverter 7a included in the amplifier inverts the input voltage 1.7 V (threshold voltage) at the point $P_1$ to about 0.2 v and the inverter 7b inverts this 0.2 V to about 5 [V], so that the output voltage at the point $P_2$ rises to 5 [V]. The time required for inverting the voltage is about 1 [nS]~several [nS] and this time is very much smaller than the delay time from one end to the other end of the word line, which is for example 20 [nS]. The voltage at the point $P_2$ is propagated after a lapse of time and voltage distribution shown by solid line (c) is obtained along the word line 3. Hereinafter, the voltage distributions (a) and (b) change so that the voltage distribution approaches to the line $P_0$-$P_2$, and finally the voltage 5 [V] is distributed along all of the word line 3. In FIG. 5, the broken line (b) shows the voltage distributions when the amplifier 7 is not used.

Accordingly, the transmission gates 2a and 2b positioned downstream of the amplifier 7 in the word line 3 are rapidly turned on by the rise of the voltage and an increase of the access time can be prevented if the gate capacitance C is increased by using the thin gate oxide film.

Figure 6A:
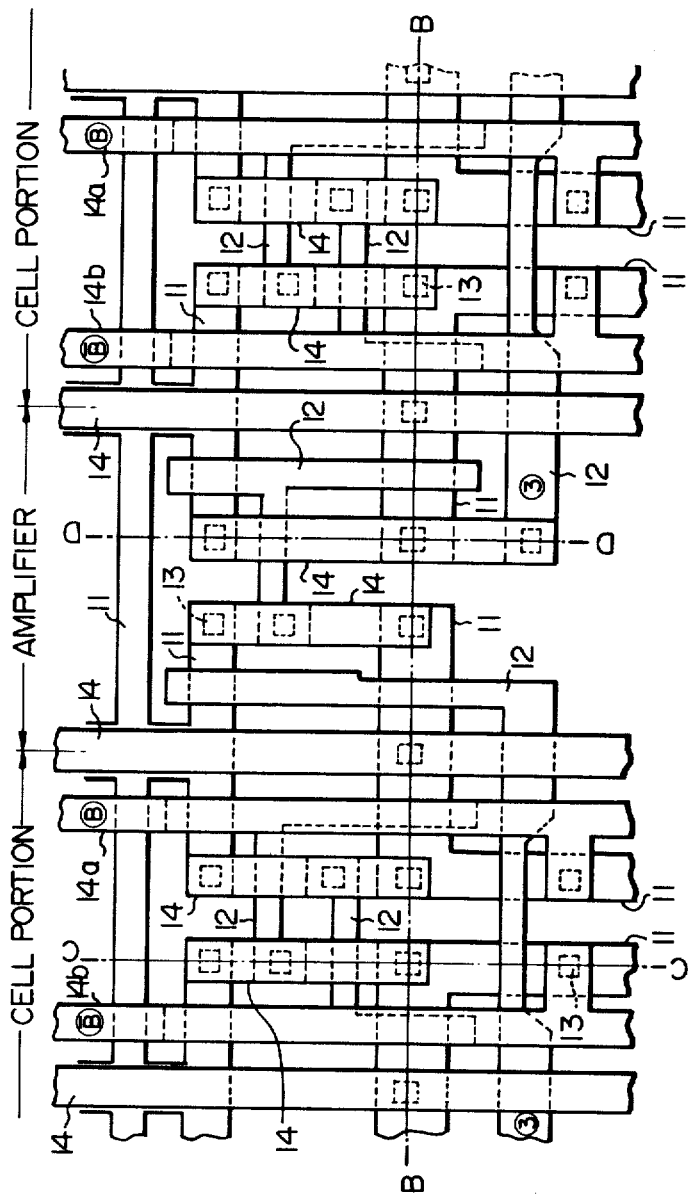
FIGS. 6A, 6B, 6C and 6D illustrate a plan view and cross sectional view of one embodiment of the static memory device which is formed by using an integrated circuit.
Figure 6B:
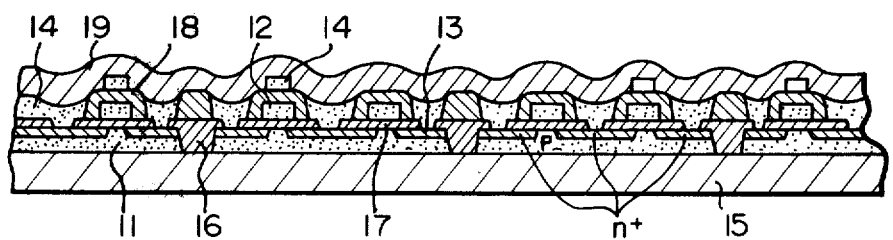
Figure 6C:
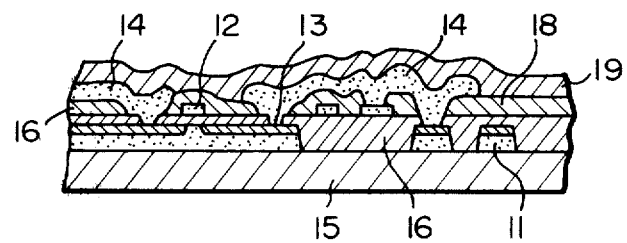
Figure 6D:
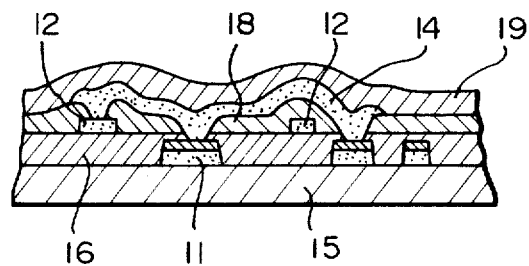

The semiconductor memory device formed by an integrated circuit having an SOS construction according to the present invention is shown in FIG. 6A. In the embodiment shown in FIG. 6A, the word lines are formed by polycrystalline silicon, the bit lines are formed by aluminum wire and the amplifier is placed in the word line. FIG. 6A illustrates a plan view of the integrated circuit, and the portion including the amplifier 7 and the memory cells 6 positioned at both sides of the amplifier is shown in FIG. 6A. FIG. 6A illustrates an epitaxial silicon island pattern which forms a first layer 11 (the lowest layer), a polycrystalline silicon pattern which forms a second layer 12, a contact hole pattern 13 in a phosphosilicate glass (PSG) layer which forms a third layer for the purpose of insulating between the layers, and an aluminum wiring pattern 14 which forms a fourth layer. FIG. 6B illustrates a sectional view along line B—B in FIG. 6A, and shows a sapphire substrate (layer) 15, an epitaxial silicon island pattern 11 which is formed on the sapphire substrate 15, the gate insulating film 17 which is formed by silicon dioxide and selectively formed on the silicon island pattern 11, an insulating layer 16 which is formed by silicon dioxide to isolate between silicon island patterns and to fill up the silicon island patterns so as to form a nearly flat surface, a polycrystalline silicon layer 12 which forms a gate electrode and a part of a wire connection, a PSG layer 18 for insulating between the polycrystalline silicon layer 12 and an aluminum wiring layer, the aluminum wiring layer 14 and a cover PSG layer 19. FIG. 6C illustrates a sectional view along line C—C in the part of the memory cell shown in FIG. 6A, and the sapphire substrate 15, the epitaxial silicon island layer 11, the insulating layer 16, the polycrystalline silicon layer 12, the PSG layer 18, the aluminum wiring layer 14 and the cover PSG layer 19 are shown referring to FIG. 6C. FIG. 6D illustrates a sectional view of the amplifier along line D—D in FIG. 6A, and the sapphire substrate 15, the silicon island pattern 11, the insulating layer 16, the polycrystalline silicon layer 12, the PSG layer 18, the aluminum wiring layer 14 and the cover PSG layer 19 are shown referring to FIG. 6D.

Figure 7A:
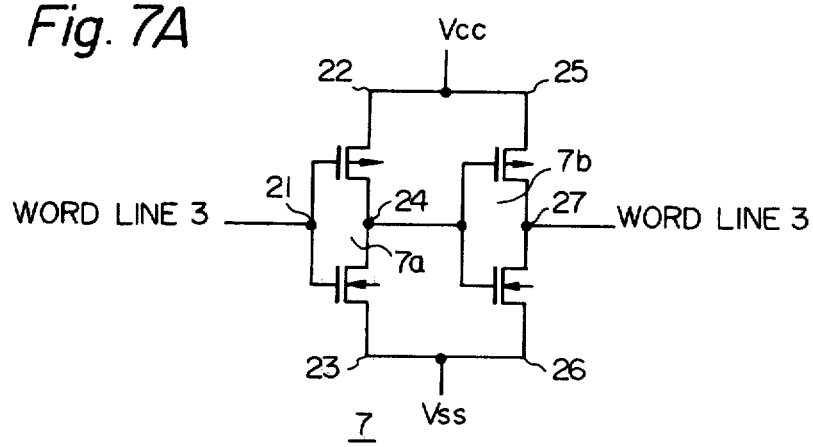
FIGS. 7A and 7B illustrate an equivalent circuit of one embodiment of an amplifier circuit used in FIGS. 4 and 6 and a plan view of the circuit which is formed by using the integrated circuit, respectively.
Figure 7B:
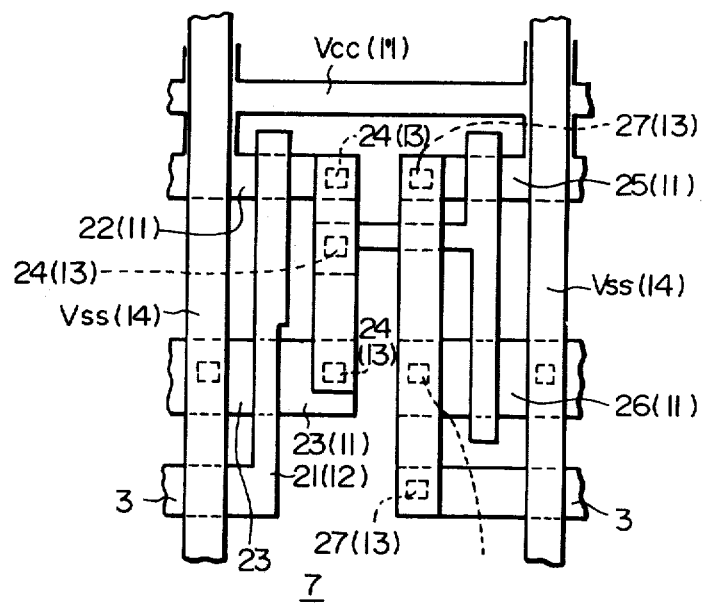

FIG. 7A illustrates an equivalent circuit in a portion of the amplifier 7 in the semiconductor memory device according to the present invention. As shown in FIG. 7A, the amplifier 7 is formed by the C-MOS invertors 7a and 7b which are connected in series. The portions 21, 22, 23, 24, 25, 26 and 27 in the amplifier 7 shown in FIG. 7A correspond to the same reference numerals 21 through 27 shown in FIG. 7B. Referring to FIG. 7B, the portions which is correspond to FIG. 6A are shown by the reference numerals in the brackets.

As explained in detail above, in the present invention, the amplifier is inserted, for example, in the word line so that the resistance loss in the word line is compensated in the RC network. Therefore, the delay time is further increased when the word line is longer, and it is clear that the increase of the access time can be removed by inserting several amplifiers in different portions of the same word line.

Accordingly, according to the present invention, the increase of the access time can be easily prevented when the thin gate oxide film is used for the purpose of increasing the value $\beta$ of the transistor or by using the short channel of the transistor, or when long bit lines are used in the memory device.

In the above-mentioned embodiment according to the present invention, the amplifier is placed in the word lines. However, when the bit lines are formed by the wire connection regions which are formed in the polycrystalline semiconductor layer or in the bulk semiconductor substrate (layer) by diffusion, the resistance in the bit lines increases so that the access time to the bit lines also increases. This increase of the access time can be improved by inserting the amplifier in a suitable position between memory cells in the bit lines.

What is claimed is:

1. A semiconductor memory device comprising a plurality of bit wires, a plurality of transmission gates connected to said bit wires, a plurality of memory cells each of which is connected to a different pair of said bit wires via a respective pair of said transmission gates, at least one word line each of which is connected to respective ones of said memory cells via the control terminal of the respective ones of said transmission gates, each said word line comprising a distributed resistance that contributes to the decay of a voltage signal applied selectively to said at least one word line, and at least one amplifier which is inserted in said word line between respective adjacent pair of said memory cells to maintain said voltage signal along each respective word line.

2. A semiconductor memory device according to claim 1, wherein said memory cells are static memory cells which are formed by using MOS field, effect transistors having a bulk construction.

3. A semiconductor memory device according to claim 1, wherein said memory cells are static memory cells which are formed by using MOS field effect transistors having an SOS (silicon on sapphire) construction.

4. A semiconductor memory device according to claim 1, wherein said amplifier is formed by two inverters which are connected in series.

5. A semiconductor memory device comprising a plurality of bit lines, each said bit line comprising a distributed resistance that contributes to the decay of a voltage signal applied to said line, a plurality of transmission gates connected to said bit wires, a plurality of memory cells each of which is connected to a different pair of said bit lines via a respective pair of said transmission gates, at least one word line each connected to respectives ones of said memory cells via the respective control terminal of said transmission gates, and at least one pair of amplifiers respectively inserted in at least one of said pair of bit lines between two of said memory cells to maintain said voltage signal along each respective pair of bit lines.

6. The device of claim 1 or 5, said lines comprising polycrystalline silicon.

7. The device of claim 1 or 5, said lines comprising doped semiconductor bulk.

* * * * *